United States Patent
Setton et al.

(10) Patent No.: US 9,437,400 B2
(45) Date of Patent: Sep. 6, 2016

(54) INSULATED DIELECTRIC WINDOW ASSEMBLY OF AN INDUCTIVELY COUPLED PLASMA PROCESSING APPARATUS

(75) Inventors: David Setton, Danville, CA (US); Gautam Bhattacharyya, San Ramon, CA (US); Brett C. Richardson, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 931 days.

(21) Appl. No.: 13/462,305

(22) Filed: May 2, 2012

(65) Prior Publication Data

US 2013/0292055 A1    Nov. 7, 2013

(51) Int. Cl.
C23C 16/00 (2006.01)
H01L 21/326 (2006.01)
H01J 37/32 (2006.01)

(52) U.S. Cl.
CPC ..... H01J 37/32119 (2013.01); *Y10T 29/49826* (2015.01)

(58) Field of Classification Search
CPC .............. H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 6,051,073 A * | 4/2000 | Chu | H01J 37/321 118/723 E |
| 6,280,563 B1 * | 8/2001 | Baldwin, Jr. | H01J 37/32009 118/723 I |
| 6,302,966 B1 | 10/2001 | Bailey, III et al. | |
| 6,308,654 B1 | 10/2001 | Schneider et al. | |
| 6,953,005 B2 | 10/2005 | Suzuki | |
| 7,223,321 B1 | 5/2007 | Comendant et al. | |
| 7,708,859 B2 | 5/2010 | Huang et al. | |
| 7,780,791 B2 | 8/2010 | Sharpless et al. | |
| 7,977,390 B2 | 7/2011 | Ji et al. | |
| 8,088,248 B2 | 1/2012 | Larson | |
| 8,114,246 B2 | 2/2012 | Ni et al. | |
| 8,119,532 B2 | 2/2012 | Sant | |
| 8,597,463 B2 | 12/2013 | Sasaki | |
| 2007/0181257 A1 | 8/2007 | Comendant et al. | |
| 2010/0243164 A1 | 9/2010 | Sharpless et al. | |
| 2011/0056626 A1 * | 3/2011 | Brown et al. | 156/345.33 |
| 2011/0115380 A1 * | 5/2011 | Ebe et al. | 315/111.41 |
| 2011/0168673 A1 | 7/2011 | Nishimoto | |
| 2012/0031561 A1 * | 2/2012 | Kim | 156/345.48 |
| 2012/0090784 A1 * | 4/2012 | Ouye et al. | 156/345.37 |

OTHER PUBLICATIONS

Search Report and Written Opinion mailed May 29, 2014 for Singapore Patent Appln. No. 201303444-2.

* cited by examiner

*Primary Examiner* — Luz Alejandro Mulero
(74) *Attorney, Agent, or Firm* — Buchanan Ingersoll & Rooney PC

(57) ABSTRACT

An insulated dielectric window assembly comprising a dielectric window of an inductively coupled plasma processing apparatus; an upper polymeric ring, and a lower polymeric ring. The upper polymeric ring insulates the outer edge of the dielectric window from a cooler ambient atmosphere and the lower polymeric ring insulates the lower surface of the dielectric window from a chamber surface supporting the window.

24 Claims, 6 Drawing Sheets

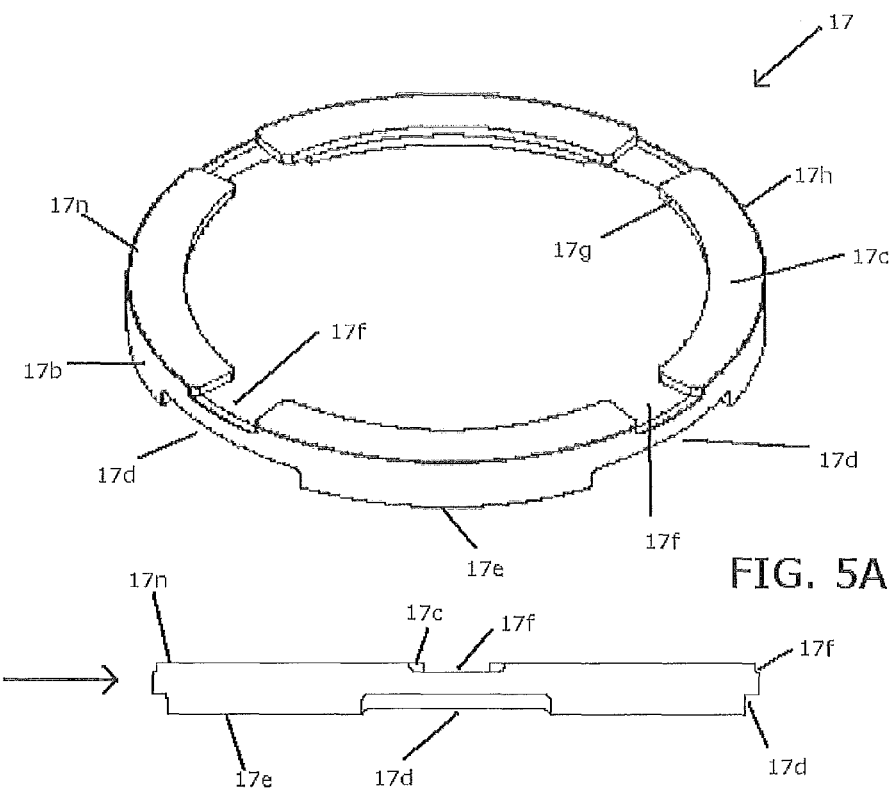
FIG. 5A
FIG. 5B
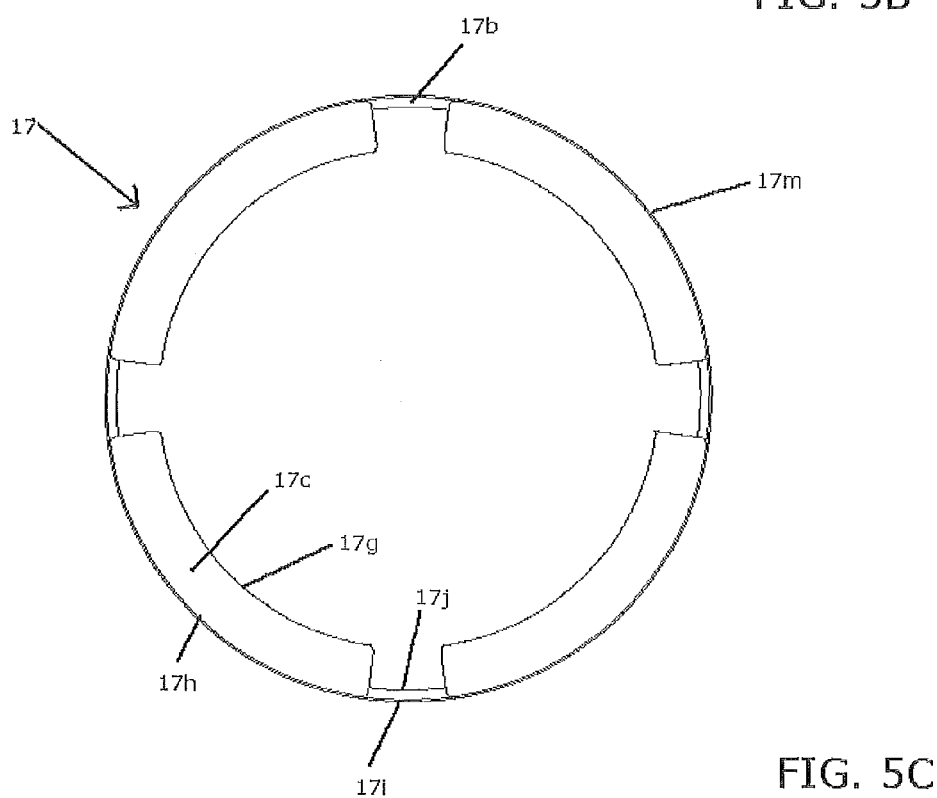
FIG. 5C

INSULATED DIELECTRIC WINDOW ASSEMBLY OF AN INDUCTIVELY COUPLED PLASMA PROCESSING APPARATUS

FIELD OF THE INVENTION

The present invention relates in general to semiconductor substrate manufacturing technologies and in particular to a dielectric window assembly of an inductively coupled plasma processing chamber.

BACKGROUND

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit or MEMs device. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. An etching gas is then flowed into the chamber and energized to form a plasma to etch exposed areas of the substrate.

Referring now to FIG. 1, a simplified diagram of an inductively coupled plasma processing apparatus 200 includes a plasma chamber (chamber) 202 having a bottom chamber section 250 forming a sidewall of the chamber, an upper chamber section 244 also forming a sidewall of the chamber, and a cover 252. Process gas is flowed into chamber 202 from gas distribution system 222. The process gas may be subsequently ionized to form a plasma 260, in order to process (e.g., etching or deposition) exposed areas of substrate 224, such as a semiconductor substrate or a glass pane, supported on an electrostatic chuck (chuck) 216 with an edge ring 215 around the outer periphery of the chuck 216. Details of an exemplary gas distribution system may be found in commonly-owned U.S. Pat. No. 8,088,248, the disclosure of which is hereby incorporated by reference. Plasma processing gases commonly used include $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, and $Cl_2$.

Induction coil 231 is separated from the interior of the plasma chamber by a dielectric window 204 forming the upper wall of the chamber, and generally induces a time-varying electric current in the plasma processing gases to create plasma 260. The window both protects induction coil from plasma 260, and allows the generated RF field 208 to generate an inductive current 211 within the plasma processing chamber. Further coupled to induction coil 231 is matching network 232 coupled to RF generator 234. The RF generator 234 supplies RF current preferably at a range of about 100 kHz-100 MHz, and more preferably at 13.56 MHz. Matching network 232 attempts to match the impedance of RF generator 234 to that of the plasma 260 (typically operating at about 13.56 MHz and about 50 ohms). Additionally, a second RF energy source 238 may also be coupled through matching network 236 to the bottom electrode 216 in order to apply an RF bias to the substrate 224 (e.g., 2 MHz). Gases and byproducts are removed from the chamber by a vacuum pump 220.

Generally, some type of cooling system 240 is coupled to chuck 216 in order to maintain the substrate 224 at a desired temperature. The cooling system itself is usually comprised of a chiller that pumps a coolant through cavities within the chuck, and helium gas is pumped between the chuck and the substrate to control thermal conductance between the substrate and the chuck. Increasing helium pressure increases the heat transfer rate and decreasing helium pressure reduces heat transfer. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific processing recipe.

In addition, a heating apparatus 246 may operate to control the temperature of the upper chamber section 244 of the plasma processing apparatus 200 such that the inner surface of the upper chamber section 244, which is exposed to the plasma during operation, is maintained at a controlled temperature.

The upper chamber section 244 can be a machined piece of aluminum or hard anodized aluminum which can be removed for cleaning or replacement thereof. The inner surface of the upper chamber section is preferably anodized aluminum or a plasma resistant material such as a thermally sprayed yttria coating.

The volume of material in the upper chamber section tends to add a substantial thermal mass to the plasma processing system. Thermal mass refers to materials that have the capacity to store thermal energy for extended periods. In general, plasma processes tend to be very sensitive to temperature variation. For example, a temperature variation outside the established process recipe can directly affect the etch rate. Temperature repeatability between substrates is often desired, since many plasma processing recipes must be performed as multi-step processes at different temperatures which must be maintained within tight tolerances. Because of this, the upper chamber section is often temperature controlled in order to achieve target temperature settings.

Upper chamber section design also mitigates temperature variation in the plasma processing system. A replaceable upper chamber to reduce temperature variation employing a thermal choke, minimizing heat transfer, and a thermal mass, providing azimuthal temperature uniformity, in the upper chamber section is disclosed in commonly-owned U.S. Patent Publication No. 2011/0056626, the disclosure of which is hereby incorporated by reference.

Temperature variation control in the dielectric window of the upper chamber section would be desirable. Dielectric windows can develop non-uniform temperature gradients during processing. An upper surface to lower surface temperature gradient of the dielectric window can result from cooling the outer surface of the dielectric window by forced air or liquid and heating of the inner surface due to process conditions inside the chamber. Additionally, a center to edge temperature gradient can result from heat loss at the edge of the dielectric window to the atmosphere and thermal contact area with the chamber.

SUMMARY

Disclosed herein is an insulated dielectric window assembly for use as an upper wall of an inductively coupled plasma processing chamber in which semiconductor substrates can be processed. The insulated dielectric window assembly comprises a dielectric window and an upper polymeric ring. The dielectric window comprises a central bore extending between upper and lower surfaces which is configured to receive a top gas injector, and at least one blind bore in the upper surface configured to receive a temperature monitoring sensor. The upper polymeric ring is made of a thermally insulating material and is located on an outer exposed section of the dielectric window so as to substantially cover a side surface and an outer portion of the upper surface of the dielectric window and thereby provide a thermal barrier from a surrounding ambient atmosphere.

In one embodiment, the insulated dielectric window includes a lower polymeric ring having a cylindrical side wall and a lower annular wall extending radially inward from the side wall. The lower polymeric ring is configured to be positioned between a lower surface of the dielectric window and an upper vacuum sealing surface of a support surface of the chamber. The lower polymeric ring insulates the lower surface of the dielectric window from the support surface.

In an embodiment, the insulated dielectric window assembly is supported on an upper chamber assembly of a plasma processing chamber. The upper chamber assembly includes a top chamber interface comprising a lower vacuum sealing surface adapted to seal against a section of the plasma processing chamber and an upper annular vacuum sealing surface adapted to form a vacuum seal with the insulated dielectric window. The upper annular vacuum sealing surface comprises a groove, which is dimensioned to receive an O-ring and the lower polymeric ring. The O-ring provides a vacuum seal between the dielectric window and the top chamber interface. The lower polymeric ring surrounds the O-ring and provides a thermal barrier between the dielectric window and the top chamber interface.

In another embodiment, an upper chamber assembly of a plasma processing chamber in which semiconductor substrates can be processed comprises a top chamber interface, the insulated dielectric window assembly, and a lower polymeric ring. The top chamber interface comprises a lower annular vacuum sealing surface adapted to seal against a bottom section of the plasma chamber and an upper annular vacuum sealing surface including a groove containing an O-ring and the lower polymeric ring, the O-ring providing a vacuum seal between the dielectric window and the top chamber interface, and the lower polymeric ring surrounding the O-ring providing a thermal barrier between the dielectric window and the top chamber interface. The dielectric window comprises a disk having a uniform thickness, and the lower polymeric ring includes a cylindrical side wall and a flat lower annular wall extending radially inward from a lower end of the side wall.

BRIEF DESCRIPTION OF THE DRAWING FIGURES

FIGS. 4A-D illustrate an embodiment of the dielectric window.

FIGS. 5A-C illustrate an embodiment of the upper polymeric ring for use as a thermally insulating material on a dielectric window.

Figure 6A:
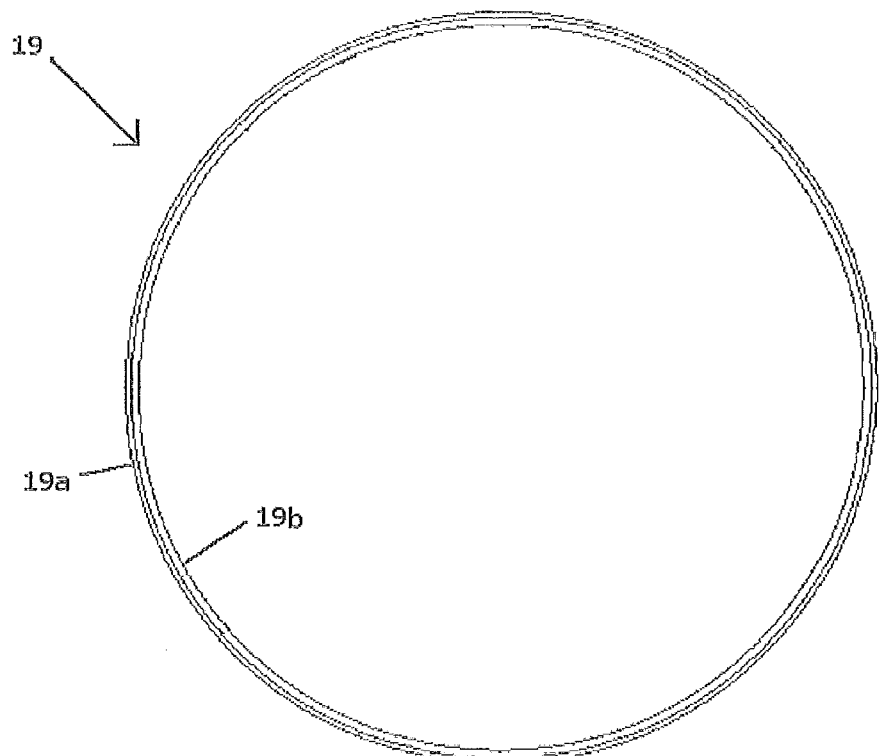
Figure 6B:
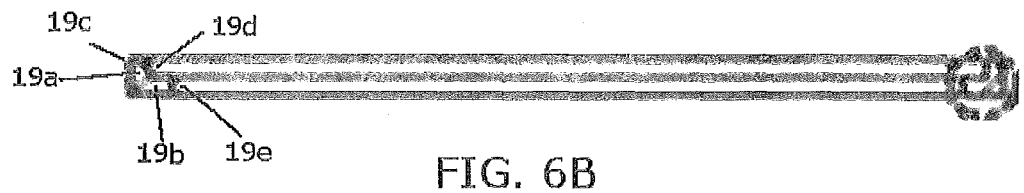
Figure 6C:
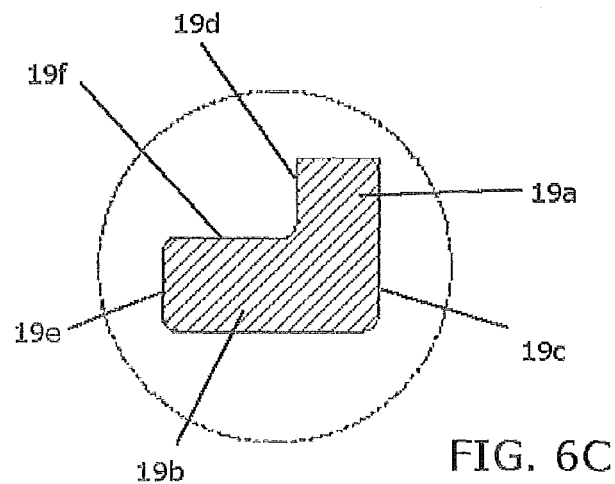

FIGS. 6A-C illustrate an embodiment of the lower polymeric ring for use between a dielectric window and a top chamber interface in an inductively coupled plasma processing chamber.

DETAILED DESCRIPTION

Disclosed herein is an insulated dielectric window assembly of an inductively coupled plasma processing chamber which will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. As used herein, the term "about" should be construed to include values up to 10% above or below the values recited.

Figure 1:
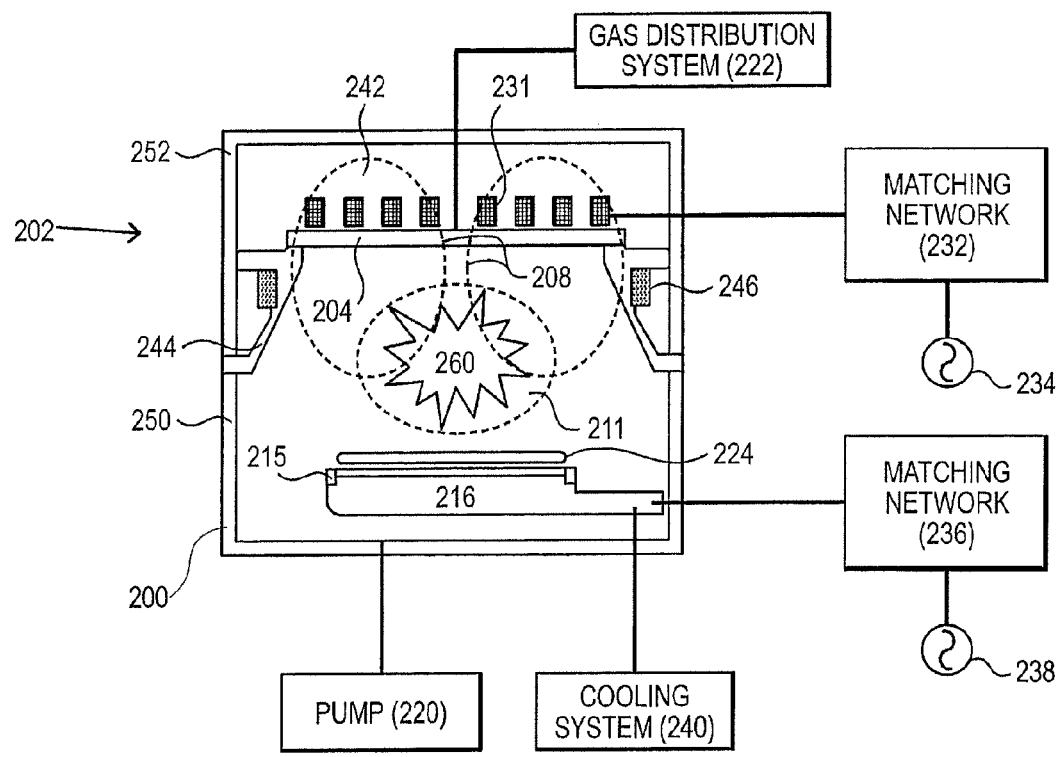
FIG. 1 shows a simplified diagram of a prior art plasma processing system.
Figure 2:
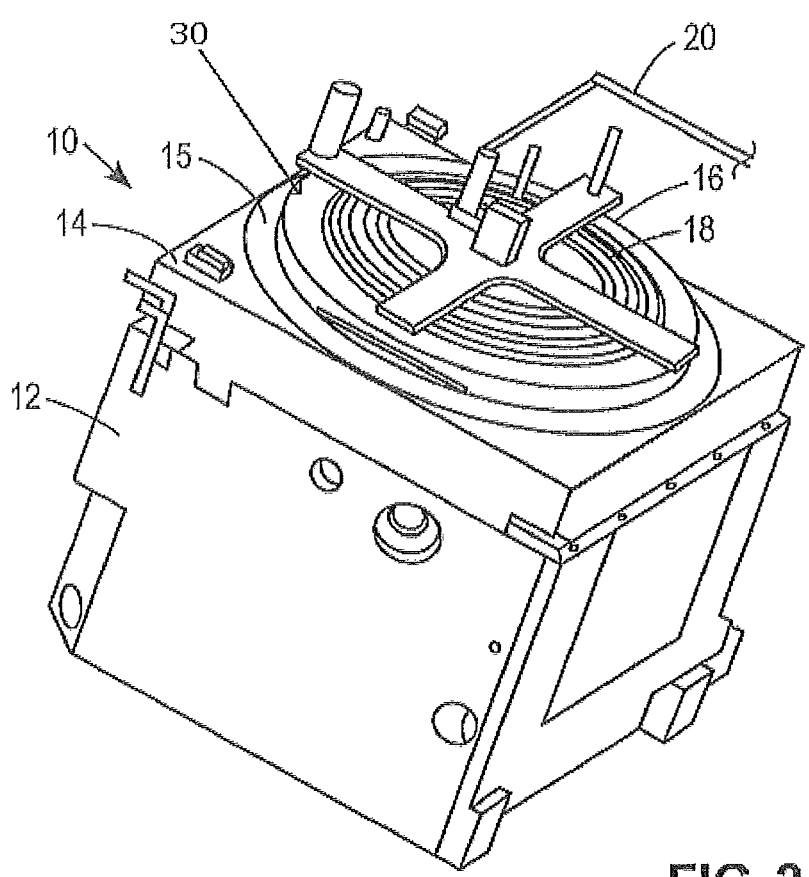
FIG. 2 shows an embodiment of an inductively coupled plasma processing chamber incorporating an insulated dielectric window assembly.

The inductively coupled plasma processing chamber shown in FIG. 2 includes a chamber 10 which includes a lower chamber 12 and an upper chamber 14. The upper chamber 14 includes a top chamber interface 15 which supports a dielectric window 16. An RF coil 18 overlies the window and supplies RF power for energizing process gas into a plasma state inside the chamber 10. A top gas injector 20a (see FIG. 3) is mounted in the center of the window for delivering process gas from gas supply line 20. The top chamber interface can have a vertical inner surface or any other desired configuration.

Figure 3:
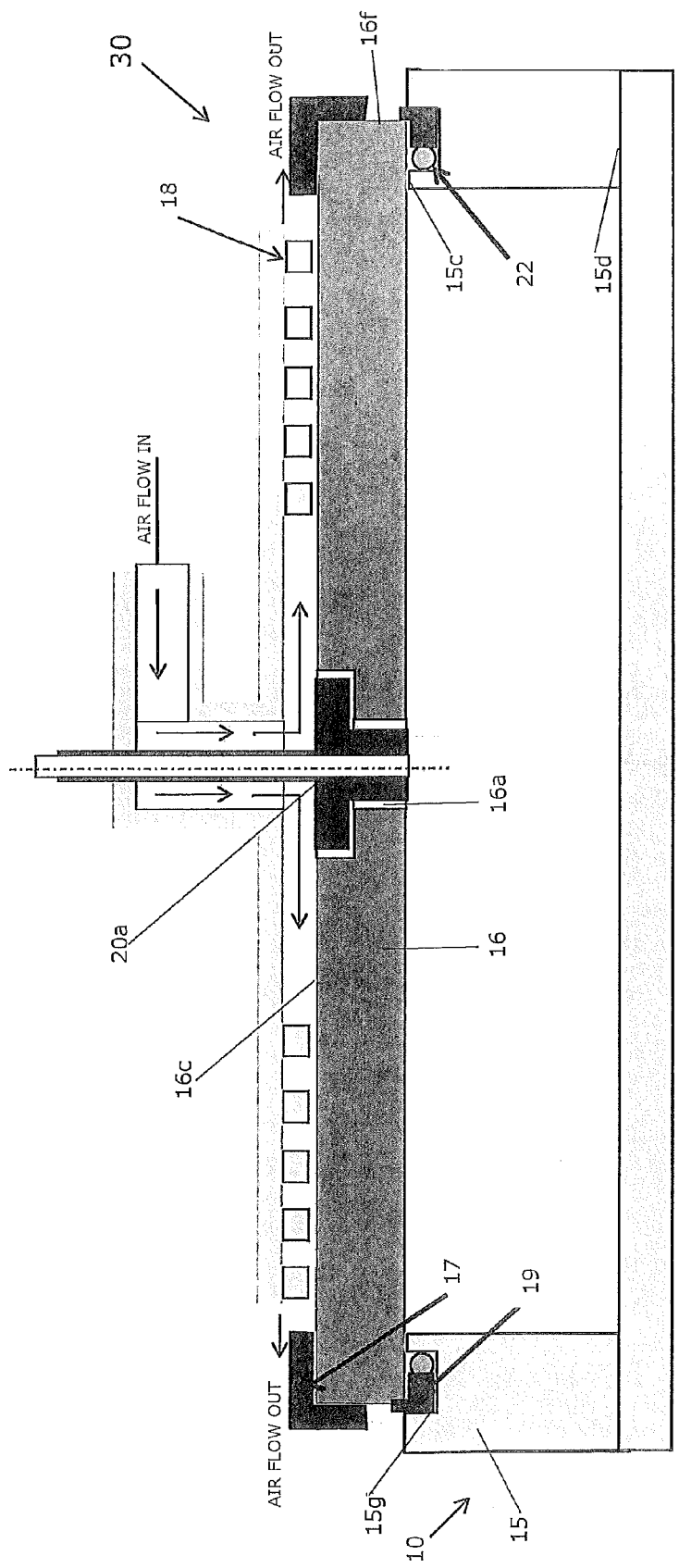
FIG. 3 shows a schematic view of an insulated dielectric window assembly of an inductively coupled plasma processing chamber wherein the assembly includes a dielectric window, an upper polymeric ring and an optional lower polymeric ring.

FIG. 3 represents a cross section of an insulated dielectric window assembly 30 which can be used in the chamber 10 shown in FIG. 2. The dielectric window 16 mounts on a support surface of the chamber 10 such as the top chamber interface 15. The insulated dielectric window assembly 30 includes dielectric window 16, an upper polymeric ring 17 of thermally insulating material on an outer exposed section of the window, and an optional lower polymeric ring 19 on an outer non-exposed section of the window. The dielectric window 16 includes a bore 16a for receipt of a top gas injector 20a and an RF coil 18 outside the dielectric window 16 surrounds the gas injector 20a. The top chamber interface 15 includes an upper vacuum sealing surface 15c, and a lower vacuum sealing surface 15d. The upper vacuum sealing surface 15c includes a groove 15g for receipt of an O-ring 22 and the lower polymeric ring 19. The O-ring 22 provides a vacuum seal between the dielectric window 16 and the top chamber interface 15. The lower polymeric ring 19 surrounds the O-ring 22 and provides a thermal barrier between the dielectric window 16 and the top chamber interface 15. The thermal barrier provided by the lower polymeric ring 19 reduces the transfer of heat from an outer portion of the dielectric window 16 to the top chamber interface 15.

The upper polymeric ring 17 substantially covers a side surface 16f and an outer portion of an upper surface 16c of the dielectric window 16. The upper polymeric ring 17 insulates and reduces the transfer of heat from the outer portion of the upper surface 16c and the side surface 16f to a surrounding ambient atmosphere. A temperature control system which includes one or more temperature sensors monitoring window temperature and a forced air cooling apparatus can be mounted above the dielectric window 16 to direct forced air across the upper surface 16c of a central section of the dielectric window 16 to maintain the dielectric window 16 at a desired temperature.

Figure 4A:
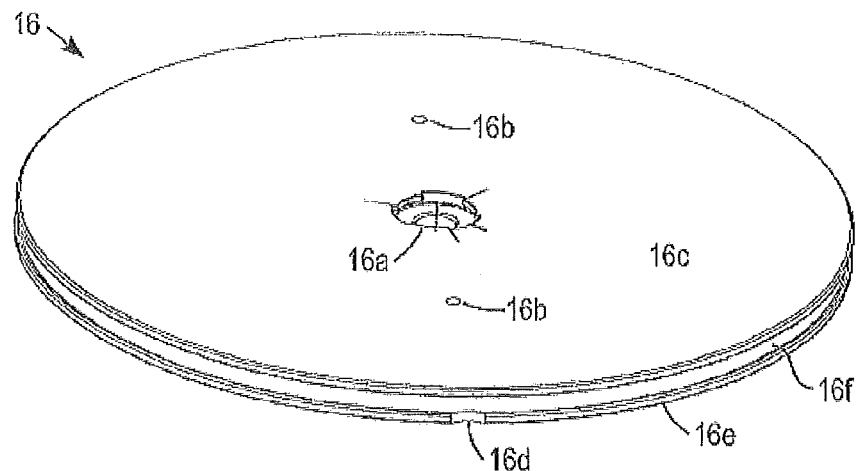
Figure 4B:
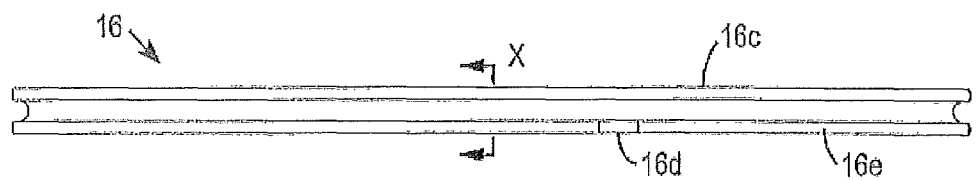
Figure 4C:
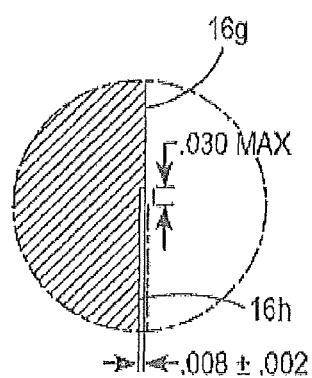
Figure 4D:
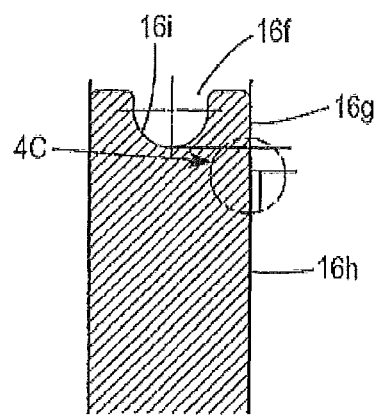

FIG. 4A shows details of the dielectric window 16 which includes a central bore 16a for receipt of the top gas injector 20a, blind holes 16b in the upper surface 16c for receipt of temperature sensors, and optionally a clocking feature 16d in a bottom flange 16e of the side surface 16f. FIG. 4B is a side view of the dielectric window 16 shown in FIG. 4A. FIG. 4C shows details of a vacuum sealing surface 16g which is outward of a recessed surface 16h which is coated with a ceramic coating such as plasma sprayed yttrium oxide. FIG. 4D is a cross section of the outer periphery of the dielectric window 16 wherein a rounded annular recess 16i extends into and completely around the side surface 16f.

The dielectric window 16 may be composed of quartz or a ceramic material such as alumina or aluminum nitride. Preferably, the dielectric window 16 is composed of alumina. In an embodiment for processing 300 mm wafers, the dielectric window 16 can be about 1 inch thick and have a diameter of about 14.5 inches. However, the dielectric window 16 can be smaller or larger, e.g. have a diameter of about 13.5 inches, 22 inches, or even larger.

FIG. 5A is a perspective top view of an embodiment of the upper polymeric ring 17 of thermally insulating material. The upper polymeric ring 17 comprises a cylindrical side wall 17b and an annular upper wall 17c extending radially inward from the side wall 17b. The cylindrical side wall 17b includes four circumferentially extending lower cutouts 17d which extend into a lower end 17e of the cylindrical side wall 17b. The lower cutouts 17d are dimensioned to provide clearance for chamber components (not shown). The annular upper wall 17c includes four circumferentially extending upper cutouts 17f which extend radially from an inner edge 17g to an outer edge 17h of the annular upper wall 17c and extend into an upper end 17n of the cylindrical side wall 17b. The four upper cutouts 17f are dimensioned to provide clearance for the RF coil 18 and/or associated mounting brackets. The four lower cutouts 17d and the four upper cutouts 17f have rounded corners.

In a preferred embodiment, the four lower cutouts 17d and the four upper cutouts 17f have different lengths and the four lower and upper cutouts 17d, 17f have midpoints which are vertically aligned. The vertically aligned midpoints of the four upper and lower cutouts 17f, 17d are preferably circumferentially spaced 90° apart. The four upper cutouts 17d each extend about 10 to 20° along the circumference of the annular upper wall 17c. Preferably the four upper cutouts 17d each extend about 15° along the circumference of the annular upper wall 17c.

FIG. 5B illustrates a side view of an embodiment of the polymeric ring 17. In the preferred embodiment, the cylindrical side wall 17b of the polymeric ring 17 has a total height of about 1.3 inches, and the annular upper wall 17c has a thickness of about 0.25 inch. The four upper cutouts 17f each have a height of about 0.25 inch and extend into the upper end 17n of the cylindrical sidewall 17b. The four lower cutouts 17d each extend about 30 to 45° along the circumference of the cylindrical side wall 17b. Preferably the four lower cutouts 17d each extend about 38° along the circumference of the cylindrical side wall 17b and extend into the lower end 17e of the cylindrical side wall 17b. In a preferred embodiment, three of the four lower cutouts 17d have a height of about 0.53 inch while the remaining cutout 17d has a height of about 0.13 inch.

FIG. 5C illustrates a top view of an embodiment of the upper polymeric ring 17. In the preferred embodiment, the cylindrical side wall 17b has an outer surface 17i with a diameter of about 15.25 inches and an inner surface 17j with a diameter of about 14.75 inches. The outer edge 17h of the annular upper wall 17c has an outer diameter of about 15.25 inches and the inner edge 17g has an inner diameter of about 12.5 inches.

In alternate embodiments the upper polymeric ring 17 may have different configurations and dimensions to support larger or smaller dielectric windows (e.g., diameters of about 13.5 inch, 14.5 inches, 22 inches, or larger and thicknesses of less than or greater than 1 inch) and/or fit around hardware adjacent the window.

The upper polymeric ring 17 can be composed of a polymeric material, preferably a vulcanized silicone-based polymer material, such as silicone foam rubber. The material can have a hardness of about a 10-50 durometer Shore A value. In a preferred embodiment the upper polymeric ring 17 may have a coating 17m of about 0.05 inch of an additional polymeric material. Preferably the coating 17m is a vulcanized silicone-based polymer material with a Shore A hardness value of about 65-75 durometers. In a preferred embodiment the coating 17m is applied to an upper surface 17k of the annular upper wall 17c and an outer surface 17l of the cylindrical side wall 17b. In a more preferred embodiment the coating 17m is applied to all surfaces not in direct contact with the dielectric window 16.

FIG. 6A illustrates a top view of an embodiment of the lower polymeric ring 19. The lower polymeric ring 19 has a cylindrical side wall 19a and a lower annular wall 19b extending radially inward from the cylindrical side wall 19a. FIG. 6B illustrates a side view of the embodiment of the lower polymeric ring 19. In a preferred embodiment, the cylindrical side wall 19a has an outer surface 19c which has a diameter of about 14.95 inches, an inner surface 19d which has a diameter of about 14.75 inches and the lower annular wall 19b has an inner surface 19e which has a diameter of about 14.45 inches. In alternate embodiments the lower polymeric ring 19 may have alternate dimensions to support various sized dielectric windows 16.

FIG. 6C shows a cross section of the lower polymeric ring 19. In a preferred embodiment, the lower annular wall 19b has a flat upper surface 19f which contacts the underside of the dielectric window 16, the cylindrical side wall 19a has a height of about 0.2 inch and the lower annular wall 19b has a thickness of about 0.1 inch. The lower polymeric ring 19 has rounded edges.

The lower polymeric ring 19 can be composed of a polymer material or preferably a fluorocarbon polymer material such as polytetrafluoroethylene (sold under the trademark "TEFLON") or polyvinylidene difluoride (PVDF) material. More preferably the lower polymeric ring 19 is composed from a glass reinforced silicone. An exemplary glass reinforced silicone that can be used is sold under the trademark "GAROLITE G7". The lower polymeric ring 19 surrounds the O-ring 22 in the groove 15g of the top chamber interface 15. In a preferred embodiment the bottom of the dielectric window 16 rests on the upper surface 19f of the lower polymeric ring 19. The lower annular wall 19b of the lower polymeric ring 19 reduces heat loss from an outer portion of a lower surface 16j of the dielectric window 16 to the top chamber interface 15. The cylindrical side wall 19a of the lower polymeric ring 19 reduces heat loss from a lower portion of the side surface 16f of the dielectric window 16 to the top chamber interface 15.

In an embodiment, the top chamber interface 15 may comprise a heater (not shown). The heater is generally used to maintain the top chamber interface 15 temperature within a range from about 50 to about 70° C. However, during the etching process, top chamber interface 15 temperatures may exceed the heater operational range, thus eliminating the need to operate the heater. Details of an exemplary top chamber interface 15 comprising a heater may be found in commonly-owned U.S. Patent Application 2007/0181257, the disclosure of which is hereby incorporated by reference.

Large temperature gradients should be avoided in the dielectric window 16 during operation of the plasma processing chamber. An upper surface to lower surface temperature gradient of the dielectric window 16 results from cooling the outer surface of the window by forced air or liquid, and heating of the inner surface due to process conditions inside the chamber. A center to edge temperature gradient also can result from heat loss at the edge of the dielectric window 16 to the atmosphere and thermal heat transfers with the top chamber interface 15. High temperature gradients will lead to internal stresses in the dielectric window 16, which may lead to failure of the dielectric window 16 and may result in cracking of the dielectric window 16. Additionally, variations in the top chamber interface 15 temperature due to a thermal path between the dielectric window 16 and the top chamber interface 15 can cause wafer to wafer process drift while plasma processing a batch of wafers. The insulated dielectric window assembly described herein minimizes heat transfer to the atmosphere and to the chamber interface.

In use, the dielectric window 16 can be cooled where it has the highest thermal loads and the upper and lower polymeric rings provide thermal insulation of the dielectric window 16 where it has the lowest thermal loads to thus reduce the thermal gradients seen by the dielectric window 16 and lower the average temperature of the dielectric window 16. Reduction in thermal gradients will reduce internal stresses within the dielectric window 16, and reduce wafer to wafer process shifts while plasma processing.

Having disclosed exemplary embodiments and the best mode, modifications and variations may be made to the disclosed embodiments while remaining within the subject and spirit of the invention as defined by the following claims.

What is claimed is:

1. An insulated dielectric window assembly for use as an upper wall of an inductively coupled plasma processing chamber in which semiconductor substrates can be processed, the insulated dielectric window assembly comprising:
a dielectric window including a central bore extending between upper and lower surfaces configured to receive a top gas injector and at least one blind bore in the upper surface configured to receive a temperature monitoring sensor;
an upper polymeric ring of a thermally insulating material on an outer exposed section of the dielectric window, the upper polymeric ring including a cylindrical side wall and an annular upper wall extending radially inward from an upper end of the cylindrical side wall, the cylindrical side wall on a side surface of the dielectric window and the annular upper wall on an outer portion of the upper surface of the dielectric window so as to provide a thermal barrier from a surrounding ambient atmosphere; and
a lower polymeric ring wherein a lower surface of the dielectric window is positioned on an upper surface of the lower polymeric ring so as to provide a thermal barrier between the dielectric window and a support surface of the plasma processing chamber.

2. The dielectric window assembly of claim 1, wherein the cylindrical side wall includes four lower cutouts circumferentially spaced apart and extending into a lower end thereof and the annular upper wall includes four upper cutouts circumferentially spaced apart and extending radially from an inner edge to an outer edge of the annular upper wall.

3. The dielectric window assembly of claim 2, wherein the lower cut outs extend about 30 to 45° around the circumference of the upper polymeric ring and the upper cutouts extend about 10 to 20° around the circumference of the upper polymeric ring, the four lower cutouts and the four upper cutouts having vertically aligned midpoints.

4. The dielectric window assembly of claim 3, wherein the vertically aligned midpoints of the four upper and lower cutouts are spaced 90° apart.

5. The dielectric window assembly of claim 1, wherein the thermally insulating material is silicone foam rubber with a durometer Shore A hardness value between 10 and 50.

6. The dielectric window assembly of claim 1, wherein the upper polymeric ring has a coating of about 0.05 inch of a silicone rubber with a durometer Shore A hardness value between 65 and 75.

7. The dielectric window assembly of claim 6, wherein the coating is only applied to surfaces of the upper polymeric ring not in contact with the dielectric window.

8. The dielectric window assembly of claim 1, wherein the lower polymeric ring includes a cylindrical side wall and a lower annular wall extending radially inward from a lower end of the side wall.

9. The dielectric window assembly of claim 1, wherein the lower polymeric ring is fabricated from a glass reinforced silicone.

10. The dielectric window assembly of claim 1, wherein the lower polymeric ring is fabricated from a fluorocarbon polymer material.

11. The dielectric window assembly of claim 1, wherein the dielectric window is fabricated from quartz, aluminum nitride, or alumina.

12. An upper chamber assembly of a plasma processing chamber in which semiconductor substrates can be processed, comprising a top chamber interface, the insulated dielectric window assembly of claim 1, wherein:
the top chamber interface comprises a lower annular vacuum sealing surface adapted to seal against a bottom section of the plasma chamber and an upper annular vacuum sealing surface including a groove containing an O-ring and the lower polymeric ring, the O-ring providing a vacuum seal between the dielectric window and the top chamber interface, and the lower polymeric ring surrounding the O-ring providing a thermal barrier between the dielectric window and the top chamber interface;
the dielectric window comprises a disk having a uniform thickness; and
the lower polymeric ring includes a cylindrical side wall and a lower annular wall extending radially inward from a lower end of the side wall.

13. The upper chamber assembly of claim 12, wherein the cylindrical side wall includes four lower cutouts circumferentially spaced apart and extending into a lower end thereof and the annular upper wall includes four upper cutouts circumferentially spaced apart and extending radially from an inner edge to an outer edge of the annular upper wall.

14. The upper chamber assembly of claim 13, wherein the lower cut outs extend about 30 to 45° around the circumference of the upper polymeric ring and the upper cutouts extend about 10 to 20° around the circumference of the upper polymeric ring, the four lower cutouts and the four upper cutouts having vertically aligned midpoints.

15. The upper chamber assembly of claim 14, wherein the vertically aligned midpoints of the four upper and lower cutouts are spaced 90° apart.

16. The upper chamber assembly of claim 12, wherein the thermally insulating material is silicone foam rubber with a durometer Shore A hardness value between 10 and 50.

17. The upper chamber assembly of claim 12, wherein the upper polymeric ring has a coating of about 0.05 inch of a silicone rubber with a durometer Shore A hardness value between 65 and 75.

18. The upper chamber assembly of claim 12, wherein the dielectric window is fabricated from alumina, quartz, or aluminum nitride.

19. An upper polymeric ring for use as a thermal barrier on an outer edge of a dielectric window of an insulated dielectric window assembly of an inductively coupled plasma processing chamber in which semiconductor substrates can be processed, the upper polymeric ring comprising:
a thermally insulating material configured to fit on an outer exposed section of the dielectric window,
the upper polymeric ring including a cylindrical side wall and an upper annular wall extending radially inward from an upper end of the cylindrical side wall, the cylindrical side wall configured to be on a side surface of the dielectric window and the annular upper wall configured to be on an outer portion of the upper surface of the dielectric window so as to provide a thermal barrier from a surrounding ambient atmosphere, wherein the cylindrical side wall includes four lower cutouts circumferentially spaced apart and extending into a lower end thereof and the annular upper wall includes four upper cutouts circumferentially spaced apart and extending radially from an inner edge to an outer edge of the annular upper wall.

20. The upper polymeric ring of claim 19, wherein the lower cut outs extend about 30 to 45° around the circumference of the upper polymeric ring and the upper cutouts extend about 10 to 20° around the circumference of the upper polymeric ring, the four lower cutouts and the four upper cutouts having vertically aligned midpoints.

21. The upper polymeric ring of claim 20, wherein the vertically aligned midpoints of the four upper and lower cutouts are spaced 90° apart.

22. The upper polymeric ring of claim 19, wherein the thermally insulating material is silicone foam rubber with a durometer Shore A hardness value between 10 and 50.

23. The upper polymeric ring of claim 19, wherein the upper polymeric ring has a coating of about 0.05 inch of a silicone rubber with a durometer Shore A hardness value between 65 and 75.

24. The upper polymeric ring of claim 23, wherein the coating is only applied to surfaces of the upper polymeric ring which do not come into contact with the dielectric window.

* * * * *